(12) United States Patent
Singh et al.

(10) Patent No.: US 10,608,637 B2
(45) Date of Patent: Mar. 31, 2020

(54) SUPPLY VOLTAGE COMPENSATION FOR AN INPUT/OUTPUT DRIVER CIRCUIT USING CLOCK SIGNAL FREQUENCY COMPARISON

(71) Applicant: STMicroelectronics International N.V., Schiphol (NL)

(72) Inventors: Prashant Singh, Greater Noida (IN); Pratap Narayan Singh, Chahania Chandauli (IN)

(73) Assignee: STMicroelectronics International N.V., Schiphol (NL)

( * ) Notice: Subject to any disclaimer, the term of this patent is extended or adjusted under 35 U.S.C. 154(b) by 134 days.

(21) Appl. No.: 15/698,022

(22) Filed: Sep. 7, 2017

(65) Prior Publication Data

US 2019/0074835 A1 Mar. 7, 2019

(51) Int. Cl.
| | |
|---|---|
| *H03K 5/22* | (2006.01) |
| *H03K 5/153* | (2006.01) |
| *H03K 19/003* | (2006.01) |
| *H03K 17/14* | (2006.01) |
| *H03K 19/1778* | (2020.01) |

(52) U.S. Cl.
CPC ....... *H03K 19/00384* (2013.01); *H03K 17/14* (2013.01); *H03K 19/1778* (2013.01)

(58) Field of Classification Search
CPC .............................................. H03K 19/00384
USPC ........................................................... 327/83
See application file for complete search history.

(56) References Cited

U.S. PATENT DOCUMENTS

| | | | |
|---|---|---|---|
| 6,980,020 B2 | 12/2005 | Best et al. | |
| 7,586,325 B1 | 9/2009 | Andrews et al. | |
| 8,981,817 B2 | 3/2015 | Kumar et al. | |
| 2007/0155341 A1* | 7/2007 | Haiut | H03L 1/026 455/75 |

\* cited by examiner

*Primary Examiner* — Metasebia T Retebo
(74) *Attorney, Agent, or Firm* — Crowe & Dunlevy

(57) ABSTRACT

A process and temperature variation operating condition that is globally applicable to an integrated circuit die is sensed in a core circuit region to generate a global process and temperature compensation signal. A voltage variation operating condition that is locally applicable to an input/output circuit within a peripheral circuit region of the integrated circuit die is sensed to generate a local voltage compensation signal. More specifically, the localized voltage operating condition is generated as a function of a measured difference in frequency between a first clock signal generated in the peripheral circuit region in response to a supply voltage subject to voltage variation and a second clock signal generated in the core circuit region in response to a fixed bandgap reference voltage. The operation of the input/output circuit is then altered in response to the global process and temperature compensation signal and in response to the local voltage compensation signal.

25 Claims, 3 Drawing Sheets

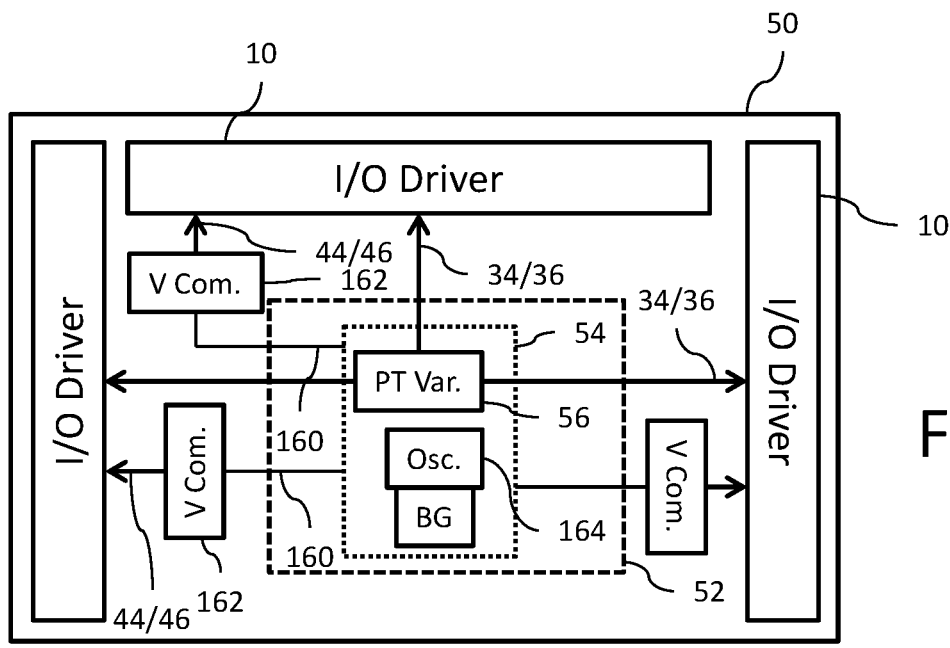
FIG. 3
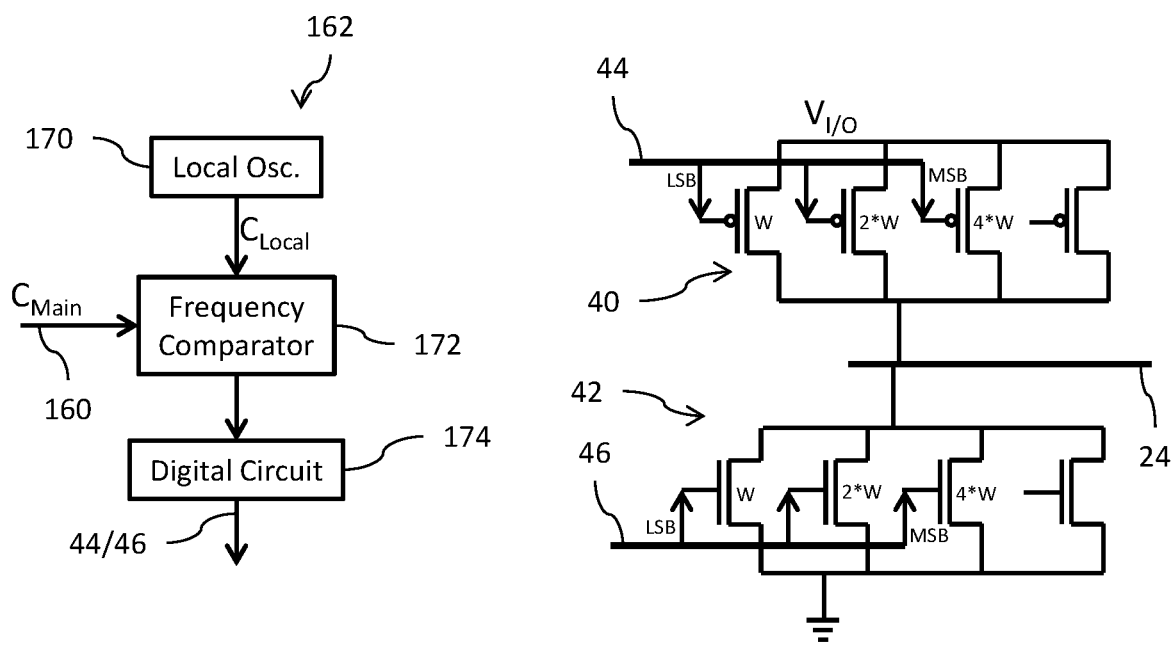
FIG. 4
FIG. 5

SUPPLY VOLTAGE COMPENSATION FOR AN INPUT/OUTPUT DRIVER CIRCUIT USING CLOCK SIGNAL FREQUENCY COMPARISON

TECHNICAL FIELD

The present disclosure generally relates to input/output circuitry for an integrated circuit and, more particularly, to supply voltage compensation for controlling operation of an input/output driver circuit.

BACKGROUND

FIG. 1 shows a block diagram of a conventional input/output (I/O) driver circuit 10 as used within an integrated circuit. The I/O driver circuit 10 provides signal conditioning for input signals and output signals associated with a coupled I/O block 12 such as an input/output circuit node. The I/O driver circuit 10 includes a PMOS driver 20 and an NMOS driver 22 that function to pull up and pull down, respectively, on signal line 24 coupled to the I/O block 12. The PMOS and NMOS drivers 20 and 22 are enabled for operation in response to assertion of the enable signals PDE and NDE as is typical for I/O driver operation. The PMOS and NMOS drivers 20 and 22 are designed to provide the required drive strength at optimal operating conditions (e.g., when process is fast, supply voltage is at a maximum, and temperature is low). However, as the operating conditions move toward more difficult parameters (e.g., when process slows, supply voltage begins to droop, and temperature is higher), the PMOS and NMOS drivers 20 and 22 are not able to provide the required drive strength. To address this concern, the I/O driver circuit 10 further includes compensation drivers to provide additional drive strength. The compensation drivers include: a PMOS process and temperature (PT) coded compensation driver 30, an NMOS PT-coded compensation driver 32, a PMOS voltage (V) coded compensation driver 40 and an NMOS V-coded compensation driver 42.

The PMOS PT-coded compensation driver 30 is configured to provide a pull up drive strength that is controlled by a digital PT-PMOS compensation control signal 34. For example, the PMOS PT-coded compensation driver 30 may include a plurality of PMOS transistors connected in parallel that are each individually controllable in response to the bits of the digital PT-PMOS compensation control signal 34 (e.g., four transistors for a 4-bit binary code). The more of the included transistors that are enabled by the digital PT-PMOS compensation control signal, the greater the pull up drive strength compensation provided by the PMOS PT-coded compensation driver 30 and, consequently, the greater the pull up drive strength of the overall I/O drive circuit 10. Conversely, the fewer of these transistors that are enabled by the digital PT-PMOS compensation control signal 34, the lesser the pull up drive strength contribution of the PMOS PT-coded compensation driver 30, and the lesser the pull up drive strength of the overall I/O drive circuit 10.

The NMOS PT-coded compensation driver 32 is configured to provide a pull down drive strength that is controlled by a digital PT-NMOS compensation control signal 36. For example, the NMOS PT-coded compensation driver 32 may include a plurality of NMOS transistors connected in parallel that are each individually controllable in response to the bits of the digital PT-NMOS compensation control signal 36 (e.g., four transistors for a 4-bit binary code). The more of the included transistors that are enabled by the digital PT-NMOS compensation control signal, the greater the pull down drive strength compensation provided by the NMOS PT-coded compensation driver 32 and, consequently, the greater the pull down drive strength of the overall I/O drive circuit 10. Conversely, the fewer of these transistors that are enabled by the digital PT-NMOS compensation control signal 36, the lesser the pull down drive strength contribution of the NMOS PT-coded compensation driver 32, and the lesser the pull down drive strength of the overall I/O drive circuit 10.

The PMOS V-coded compensation driver 40 is configured to provide a pull up drive strength that is controlled by a digital V-PMOS compensation control signal 44. For example, the PMOS V-coded compensation driver 40 may include a plurality of PMOS transistors connected in parallel that are each individually controllable in response to the bits of the digital V-PMOS compensation control signal 44 (e.g., three transistors for a 3-bit binary code). The more of the included transistors that are enabled by the digital V-PMOS compensation control signal, the greater the pull up drive strength compensation provided by the PMOS V-coded compensation driver 40 and, consequently, the greater the pull up drive strength of the overall I/O drive circuit 10. Conversely, the fewer of these transistors that are enabled by the digital V-PMOS compensation control signal 44, the lesser the pull up drive strength contribution of the PMOS V-coded compensation driver 40, and the lesser the pull up drive strength of the overall I/O drive circuit 10.

The NMOS V-coded compensation driver 42 is configured to provide a pull down drive strength that is controlled by a digital V-NMOS compensation control signal 46. For example, the NMOS V-coded compensation driver 42 may include a plurality of NMOS transistors connected in parallel that are each individually controllable in response to the bits of the digital V-NMOS compensation control signal 46 (e.g., three transistors for a 3-bit binary code). The more of the included transistors that are enabled by the digital V-NMOS compensation control signal, the greater the pull down drive strength compensation provided by the NMOS V-coded compensation driver 42 and, consequently, the greater the pull down drive strength of the overall I/O drive circuit 10. Conversely, the fewer of these transistors that are enabled by the digital V-NMOS compensation control signal 46, the lesser the pull down drive strength contribution of the NMOS V-coded compensation driver 42, and the lesser the pull down drive strength of the overall I/O drive circuit 10.

FIG. 2 shows a block diagram of an integrated circuit die 50 which includes the I/O driver circuit 10 and coupled I/O block 12. The I/O driver circuit 10 and coupled I/O block 12 are generally located at a peripheral circuit region of the integrated circuit 50. A core circuit region 52 of the integrated circuit die 50 includes functional circuitry (for example, digital circuitry, memory circuitry, digital processing circuitry, analog processing circuitry, etc.). The core circuit region 52 may, for example, be surrounded on all sides (or substantially surrounded on plural sides) by the peripheral circuit region. A centralized (or global) operating condition compensation circuit 54 located within the core circuit region 52 includes a process and temperature (PT) variation sensing circuit 56. The PT variation sensing circuit 56 generates the digital PT-PMOS compensation control signal 34 and the digital PT-NMOS compensation control signal 36 whose signal code values are dependent on variables such as process variations in the circuitry and performance variables due to temperature fluctuations that are applicable over all or substantially all of the integrated circuit die. U.S. Pat. No. 8,981,817 (incorporated by reference) teaches an example implementation of the centralized operating condition compensation circuit 54 (referred to as a PT-cell).

While the PT variation sensing circuit 56 is typically implemented centrally with respect to the die 50, voltage compensation is instead implemented closer to the I/O driver 10 at the peripheral circuit region of the die and thus concerns local conditions (i.e., conditions locally applicable to the peripheral circuit region of the die). However, a centrally generated reference voltage (such as an analog bandgap voltage) 60 is generated by a bandgap voltage generator circuit 64 and distributed from the centralized operating condition compensation circuit 54 in the core circuit region of the die 50 to the peripheral circuit region of the die. A localized voltage (V) compensation circuit 62 associated with an I/O drive circuit 10 at the peripheral circuit region of the die 50 receives the reference voltage 60 and generates the digital V-PMOS compensation control signal 44 and digital V-NMOS compensation control signal 46 whose signal code values are dependent on local voltage conditions of the I/O drive circuit 10 at the peripheral circuit region. U.S. Pat. No. 8,981,817 (incorporated by reference) teaches an example implementation of the localized voltage compensation circuit 62 (referred to as a V-cell).

SUMMARY

In an embodiment, an input/output drive circuit comprises: a first drive circuit configured to generate an input/output drive signal at an input/output node; a second drive circuit configured to alter driving of the input/output drive signal in response to a localized voltage compensation signal generated as a function of a measured difference in frequency between a first clock signal generated in response to a supply voltage for the input/output drive circuit and a second clock signal generated in response to a fixed bandgap reference voltage; and a third drive circuit configured to alter driving of the input/output drive signal in response to a centralized operating condition compensation signal generated as a function of process and temperature variation.

In an embodiment, an integrated circuit comprises: an operating condition compensation circuit configured to generate a process and temperature variation digital compensation signal; a voltage compensation circuit configured to generate a voltage variation digital compensation signal as a function of a measured difference in frequency between a first clock signal generated in response to a supply voltage subject to voltage variation and a second clock signal generated in response to a fixed bandgap reference voltage; and an input/output drive circuit configured to generate an input/output drive signal in response to the process and temperature variation digital compensation signal and the voltage variation digital compensation signal.

In an embodiment, a method comprises: sensing a process and temperature variation operating condition in an integrated circuit; generating a process and temperature compensation signal in response to the sensed process and temperature variation operating condition; sensing a voltage variation operating condition that affects the operation of an input/output circuit of said integrated circuit by measuring a difference in frequency between a first clock signal generated in response to a supply voltage subject to voltage variation and a second clock signal generated in response to a fixed bandgap reference voltage; generating a voltage compensation signal in response to the measured difference in frequency; and altering operation of said input/output circuit in response to the process and temperature compensation signal and the voltage compensation signal.

In an embodiment, a method comprises: sensing a process and temperature variation operating condition that is globally applicable to an integrated circuit die and generating a global process and temperature compensation signal; sensing a voltage variation operating condition that is locally applicable to an input/output circuit within the integrated circuit die and generating a local voltage compensation signal, wherein the localized voltage operating condition is generated as a function of a measured difference in frequency between a first clock signal generated in response to a supply voltage subject to voltage variation and a second clock signal generated in response to a fixed bandgap reference voltage; and altering operation of said input/output circuit in response to the global process and temperature compensation signal and in response to the local voltage compensation signal.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which:

FIG. 3 shows a block diagram of an integrated circuit die including the I/O drive circuit of FIG. 1 along with centralized (core circuit region based) process and temperature (PT) compensation and localized (peripheral circuit region based) voltage (V) compensation;

FIG. 4 shows a block diagram of a localized voltage compensation circuit used within the peripheral circuit region of the die of FIG. 3;

FIG. 5 shows a circuit diagram for an example PMOS V-coded compensation driver and NMOS V-coded compensation driver;

DETAILED DESCRIPTION

Figure 1:
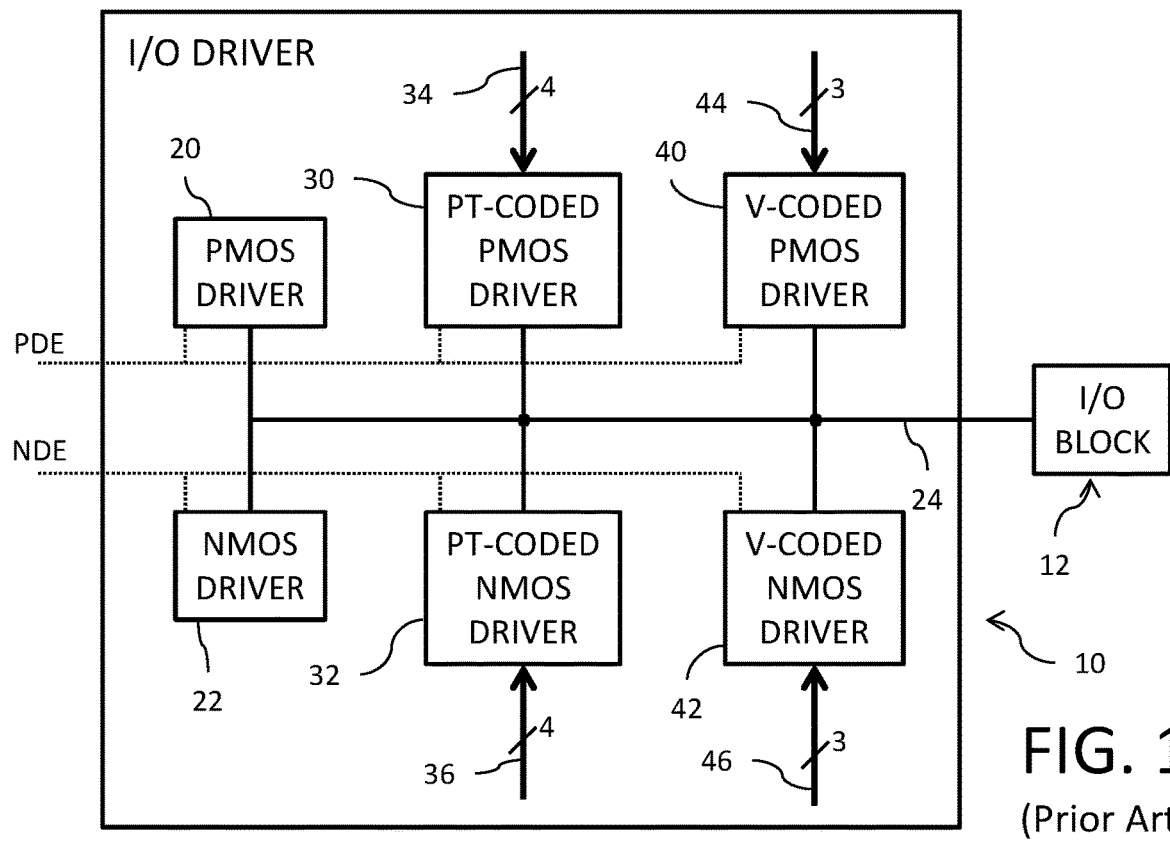
FIG. 1 shows a block diagram of a prior art input/output (I/O) drive circuit.
Figure 2:
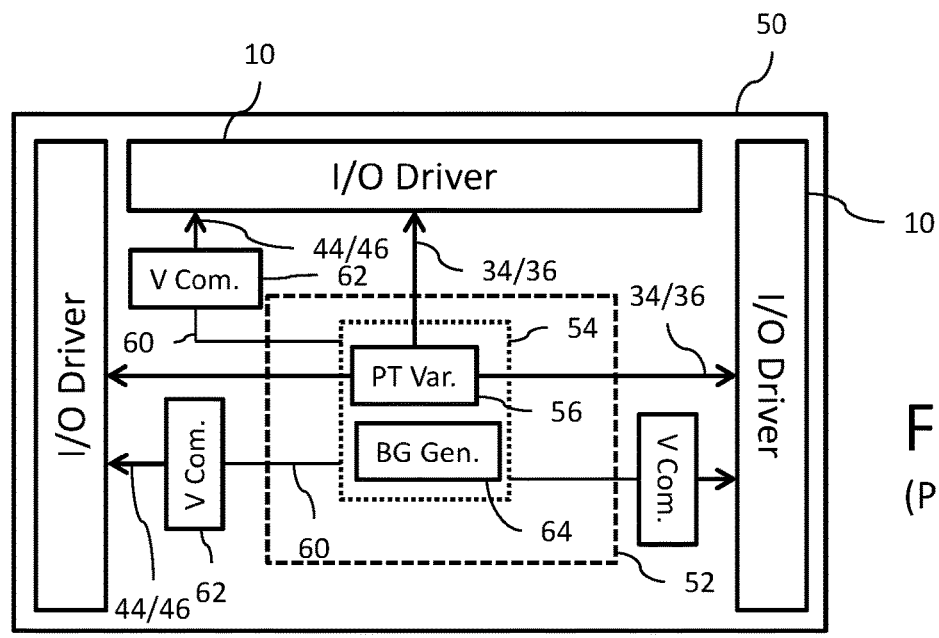
FIG. 2 shows a block diagram of a prior art integrated circuit die including the I/O drive circuit of FIG. 1 along with centralized (core circuit region based) process and temperature (PT) compensation and localized (peripheral circuit region based) voltage (V) compensation.

Reference is now made to FIG. 3 shows a block diagram of an integrated circuit die including the I/O drive circuit of FIG. 1 along with centralized (global; core circuit region based) process and temperature (PT) compensation and localized (peripheral circuit region based) voltage (V) compensation. Like reference numbers refer to like or similar components. The block diagram of FIG. 3 differs from the block diagram of FIG. 2 with respect to the implementation of the localized voltage compensation. A centrally generated reference clock signal 160 is generated by an oscillator circuit 164 with the core circuit region of the die 50 and distributed from the centralized operating condition compensation circuit 54 to the peripheral circuit region of the die 50. The oscillator circuit 164 is powered from a fixed bandgap reference voltage generator circuit (BG) used, for example, to power circuitry within the core circuit region. A localized voltage (V) compensation circuit 162 associated with an I/O drive circuit 10 at the peripheral circuit region of the die 50 receives the reference clock signal 160 and generates the digital V-PMOS compensation control signal 44 and digital V-NMOS compensation control signal 46 whose signal code values are dependent on local voltage conditions of the I/O drive circuit 10 within the peripheral circuit region.

Reference is now made to FIG. 4 showing a block diagram of the localized voltage compensation circuit 162. A local oscillator circuit 170 in the peripheral circuit region of the die 50 operates to generate a local clock signal $C_{Local}$ having a frequency that is dependent on the local supply voltage for the I/O drive circuit 10. The voltage compensation circuit 162 further receives the centrally generated reference clock signal 160 (referred to as the main clock signal $C_{Main}$) from the core circuit region of the die 50 having a frequency that is independent of the local supply voltage. A frequency comparator circuit 172 compares the frequency of the local clock signal $C_{Local}$ to the frequency of the main clock signal $C_{Main}$. A result of that comparison (indicative of a difference in frequency) is processed by a digital circuit 174 to generate the digital V-PMOS compensation control signal 44 and digital V-NMOS compensation control signal 46.

FIG. 5 shows a circuit diagram for an example PMOS V-coded compensation driver 40 and NMOS V-coded compensation driver 42. The PMOS V-coded compensation driver 40 includes a plurality of current paths, wherein each current path is formed by a source-drain path of a PMOS transistor. Each PMOS transistor in a current path has a gate terminal driven by a gate signal corresponding to one bit of the digital V-PMOS compensation control signal 44. The PMOS transistors have their source terminals coupled to a supply voltage $V_{I/O}$ for the I/O drive circuit 10 and their drain terminals coupled to the signal line 24. The NMOS V-coded compensation driver 42 includes a plurality of current paths, wherein each current path is formed by a source-drain path of an NMOS transistor. Each NMOS transistor in a current path has a gate terminal driven by a gate signal corresponding to one bit of the digital V-NMOS compensation control signal 46. The NMOS transistors have their source terminals coupled to a ground node for the I/O drive circuit 10 and their drain terminals coupled to the signal line 24.

The PMOS transistors in the PMOS V-coded compensation driver 40 and the NMOS transistors in the NMOS V-coded compensation driver 42 are configured with sizes (i.e., W/L characteristics) that are distributed in accordance with a binary weighting. As an example, a first transistor (gate driven by the least significant bit (LSB) of the digital compensation control signal) would have a weight W, a second transistor would have a weight 2*W and a third transistor (gate driven by the most significant bit (MSB) of the digital compensation control signal) would have a weight 4*W. As further shown in FIG. 5, each of the PMOS V-coded compensation driver 40 and the NMOS V-coded compensation driver 42 also includes a fourth transistor for sourcing/sinking a fixed current that is independent of the digital compensation control signal. The gates of the fourth transistors are separately biased.

Figure 6:
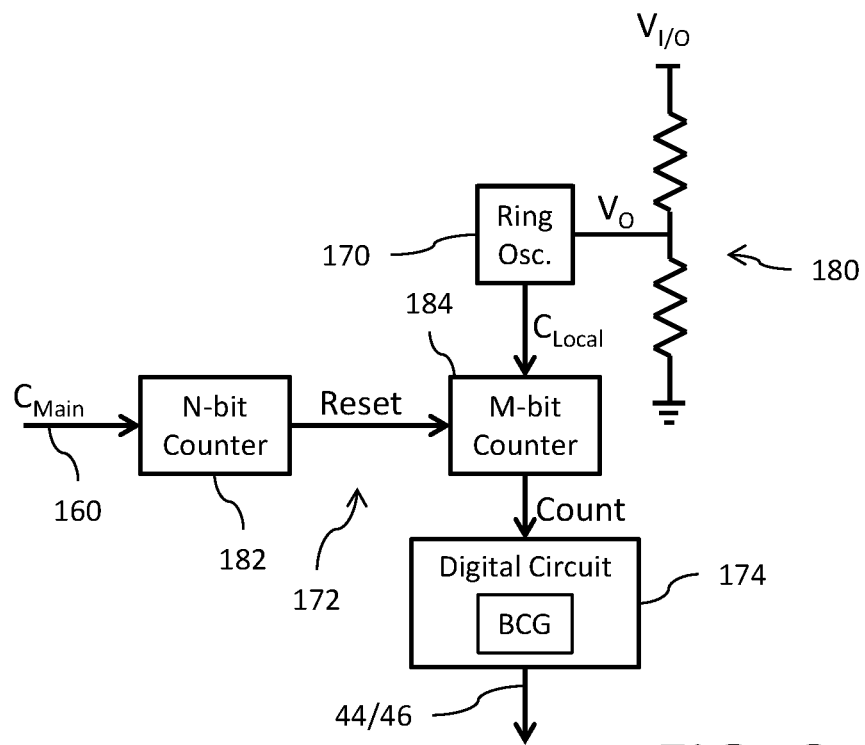
FIG. 6 shows an example circuit implementation for the localized voltage compensation circuit of FIG. 4.

FIG. 6 shows an example circuit implementation for the localized voltage compensation circuit 162. The supply voltage $V_{I/O}$ for the I/O drive circuit 10 is applied to a resistive voltage divider circuit 180 to generate an oscillator supply voltage $V_O$. The local oscillator circuit 170 generates the local clock signal $C_{Local}$ whose frequency is dependent on the oscillator supply voltage $V_O$. The frequency comparator circuit 172 is implemented using a first counter circuit 182 and a second counter circuit 184. The first counter circuit 182 receives the centrally (core circuit region) generated reference clock signal 160 (main clock signal $C_{Main}$) and the second counter circuit 184 receives the locally generated clock signal $C_{Local}$, with the first counter circuit 182 asserting a Reset signal when the count value of the first counter circuit exceeds a count threshold. The Reset signal is applied to the second counter circuit 184 which responds to assertion of the Reset signal by disabling further incrementing and freezing the count value for output to the digital circuit 174, that count value being indicative of a frequency difference between the two clock signals. The digital circuit 174 functions to convert the decimal value of the count value to a three-bit binary value.

The frequency comparator circuit 172 operates as follows: a) the count values of the first and second counter circuits 182 and 184 are set to zero; b) in response to cycles of the local clock signal $C_{Local}$ the second counter circuit 184 increments a second count value starting from decimal value zero—the frequency of the local clock signal $C_{Local}$ being dependent on the oscillator supply voltage $V_O$; c) in response to cycles of the main clock signal $C_{Main}$ the first counter circuit 182 increments a first count value—the frequency of the main clock signal $C_{Main}$ being dependent on the bandgap voltage; d) when the first count value of the first counter circuit exceeds the count threshold (for example, when the first counter circuit 182 overflows), the Reset signal is asserted; e) the second counter circuit 184 responds to assertion of the Reset signal by freezing the count value (i.e., further incrementing is disabled); f) the decimal value of the count in the frozen second counter circuit 184 is then processed through the digital circuit 174 to generate the binary code values for the digital V-PMOS compensation control signal 44 and digital V-NMOS compensation control signal 46.

In an embodiment, the count threshold is a maximum count value of the first counter circuit 182. Thus, the Reset signal is asserted when the first counter circuit 182 overflows. It will be understood, however, that a threshold value less than the overflow value could instead be used.

The first counter circuit 182 may be implemented as an N-bit counter and the second counter circuit 184 may be implemented as an M-bit counter, where M and N are not equal to each other. In an embodiment, M>N.

In a preferred implementation, the circuits for the oscillator 164 and the oscillator 170 are identical to each other (for example, both are ring oscillator circuits with a same circuit implementation). The difference in their operation and the output clock signals is primarily dependent then on the difference between the bandgap voltage powering the oscillator 164 and the supply voltage $V_O$ powering the oscillator 170.

Figure 7:
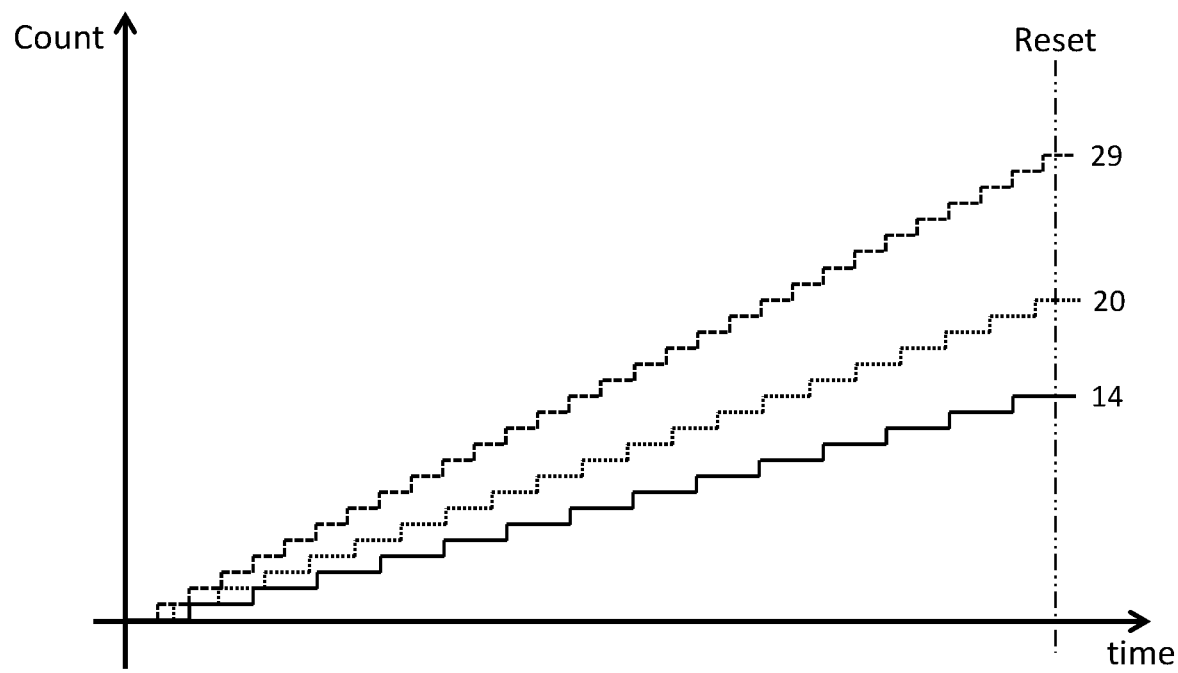
FIG. 7 illustrates the variation in the second count value output for different supply voltages of the input/output circuit in the peripheral circuit region.

FIG. 7 illustrates the variation in the second count value output from the second counter circuit 184 in response to assertion of the Reset signal for different levels of the supply voltage $V_{I/O}$ for the I/O drive circuit 10. In this example, the same main clock signal $C_{Main}$ is used and thus the Reset signal is generated at a same point in time. The second count value of 14 that is output from the second counter circuit 184 in response to assertion of the Reset signal is for a supply voltage $V_{I/O}$ level equal to a relatively low value (for example, 1.6V) with a relatively slower frequency of the local clock signal $C_{Local}$. The second count value of 20 that is output from the second counter circuit 184 in response to assertion of the Reset signal is for a supply voltage $V_{I/O}$ level equal to a middle value (for example, 1.75) with a middle frequency of the local clock signal $C_{Local}$. The third count value of 29 that is output from the second counter circuit 184 in response to assertion of the Reset signal is for a supply voltage $V_{I/O}$ level equal to a relatively high value (for example, 2.0V) with a relatively faster frequency of the local clock signal $C_{Local}$. It will be noted from the counting shown in FIG. 7 that the frequency of the local clock signal $C_{Local}$ is proportional to the supply voltage $V_{I/O}$ level.

The digital circuit 174 may, for example, include a binary code generator (BCG) circuit operable to generate the code values for the digital V-PMOS compensation control signal 44 and digital V-NMOS compensation control signal 46 in response to the second count value. The code values represent the level of compensation that is to be provided by the PMOS V-coded compensation driver 40 and NMOS V-coded compensation driver 42 in the I/O drive circuit 10. The binary value drives operation of the binary weighted transistors shown in FIG. 5. With respect to the example of FIG. 7: the decimal count value of 14 may, for example, be converted by the BCG circuit of the digital circuit 174 to a three-bit binary value of <111> (in the format of <LSB . . . MSB>) for the digital V-PMOS compensation control signal 44 and digital V-NMOS compensation control signal 46; the decimal count value of 20 may, for example, be converted by the BCG circuit of the digital circuit 174 to a three-bit binary value of <001> for the digital V-PMOS compensation control signal 44 and digital V-NMOS compensation control signal 46; and the decimal count value of 29 may, for example, be converted by the BCG circuit of the digital circuit 174 to a three-bit binary value of <000> for the digital V-PMOS compensation control signal 44 and digital V-NMOS compensation control signal 46.

The additional compensation in terms of I/O drive strength using the drivers 40 and 42 will be activated only for I/O supply voltage variation. The actuation of pull up and pull down transistors (FIG. 5) is dependent upon I/O supply voltage variation and the required value of controlled variation of I/O drive strength. For example, for an I/O supply voltage higher than the bandgap supply voltage, the binary code value for the digital V-PMOS compensation control signal 44 and digital V-NMOS compensation control signal 46 may be <000> which indicates that none of the binary weighted branches in the drivers 40 and 42 will be activated. For a typical I/O Supply voltage equal to the bandgap voltage, the binary code value for the digital V-PMOS compensation control signal 44 and digital V-NMOS compensation control signal 46 may be <001> which indicates that only the MSB binary weighted branch in the drivers 40 and 42 will be activated. For an I/O supply voltage lower than the bandgap voltage, the binary code value for the digital V-PMOS compensation control signal 44 and digital V-NMOS compensation control signal 46 may be <111> which indicates that all of the binary weighted branches in the drivers 40 and 42 will be activated.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. An input/output drive circuit, comprising:
   a first drive circuit configured to generate an input/output drive signal at an input/output node;
   a second drive circuit configured to alter driving of the input/output drive signal in response to a localized voltage compensation signal generated as a function of a measured difference in frequency between a first clock signal generated in response to a supply voltage for the input/output drive circuit and a second clock signal generated in response to a fixed bandgap reference voltage;
   a third drive circuit configured to alter driving of the input/output drive signal in response to a centralized operating condition compensation signal generated as a function of process and temperature variation;
   a frequency comparison circuit configured to compare a frequency of the first clock signal to a frequency of the second clock signal to generate said measured difference in frequency; and
   a binary code generator circuit configured to convert the measured difference in frequency to a digital voltage compensation code for the localized voltage compensation signal.

2. The input/output drive circuit of claim 1, wherein the third drive circuit comprises:
   a PMOS operating condition compensation circuit configured to receive a PMOS operating condition compensation code and to alter driving of the input/output drive signal in response to the PMOS operating condition compensation code; and
   an NMOS operating condition compensation circuit configured to receive an NMOS operating condition compensation code and to alter driving of the input/output drive signal in response to the NMOS operating condition compensation code.

3. The input/output drive circuit of claim 1, wherein the second drive circuit comprises:
   a PMOS voltage compensation circuit configured to receive a PMOS voltage compensation code and to alter driving of the input/output drive signal in response to the PMOS voltage compensation code; and
   an NMOS voltage compensation circuit configured to receive an NMOS voltage compensation code and to alter driving of the input/output drive signal in response to the PMOS voltage compensation code.

4. The input/output drive circuit of claim 3, wherein the PMOS voltage compensation code comprises a multi-bit digital code and the NMOS voltage compensation code comprises a multi-bit digital code.

5. An input/output drive circuit, comprising:
   a first drive circuit configured to generate an input/output drive signal at an input/output node;
   a second drive circuit configured to alter driving of the input/output drive signal in response to a localized voltage compensation signal generated as a function of a measured difference in frequency between a first clock signal generated in response to a supply voltage for the input/output drive circuit and a second clock signal generated in response to a fixed bandgap reference voltage;
   a third drive circuit configured to alter driving of the input/output drive signal in response to a centralized operating condition compensation signal generated as a function of process and temperature variation;

a frequency comparison circuit configured to compare a frequency of the first clock signal to a frequency of the second clock signal to generate said measured difference in frequency; and a binary code generator circuit configured to convert the measured difference in frequency to a digital PMOS voltage compensation code of the localized voltage compensation signal and a digital NMOS voltage compensation code of the localized voltage compensation signal.

6. The input/output drive circuit of claim 5, wherein the second drive circuit comprises:

a PMOS voltage compensation circuit including a plurality of PMOS transistors selectively actuated in response to bits of the digital PMOS voltage compensation code; and an NMOS voltage compensation circuit including a plurality of NMOS transistors selectively actuated in response to bits of the digital NMOS voltage compensation code.

7. The input/output drive circuit of claim 5, wherein the frequency comparison circuit comprises:

a first counter operating to count cycles of the first clock signal; and a second counter operating to count cycles of the second clock signal and generate a reset signal when a second count of the second counter reaches a threshold count;

wherein counting by the first counter is frozen in response to said reset signal with a first count of the first counter when frozen output as said measured difference in frequency.

8. An integrated circuit, comprising:

an operating condition compensation circuit configured to generate a process and temperature variation digital compensation signal;

a voltage compensation circuit configured to generate a voltage variation digital compensation signal as a function of a measured difference in frequency between a first clock signal generated in response to a supply voltage subject to voltage variation and a second clock signal generated in response to a fixed bandgap reference voltage; and an input/output drive circuit configured to generate an input/output drive signal in response to the process and temperature variation digital compensation signal and the voltage variation digital compensation signal;

wherein the voltage compensation circuit comprises:

a frequency comparison circuit configured to compare a frequency of the first clock signal to a frequency of the second clock signal to generate said measured difference in frequency;

a binary code generator circuit configured to convert the measured difference in frequency to said voltage variation digital compensation signal.

9. The integrated circuit of claim 8, comprising a peripheral circuit region of an integrated circuit die including the input/output drive circuit and a core circuit region of the integrated circuit die including the operating condition compensation circuit.

10. The integrated circuit of claim 9, further comprising a clock generator configured to generate the second clock signal in response to the fixed bandgap reference voltage, wherein the clock generator is located within the core circuit region of the integrated circuit die.

11. The integrated circuit of claim 10, further comprising an additional clock generator configured to generate the first clock signal in response to the supply voltage subject to voltage variation, wherein the additional clock generator is located within the peripheral circuit region of the integrated circuit die.

12. The integrated circuit of claim 8, wherein the voltage variation digital compensation signal comprises a digital pull up voltage compensation code that controls pull up strength of the input/output drive circuit and a digital pull down voltage compensation code that controls pull down strength of the input/output drive circuit.

13. The integrated circuit of claim 12, wherein the input/output drive circuit comprises:

a pull up voltage compensation circuit including a plurality of pull up transistors selectively actuated in response to bits of the digital pull up voltage compensation code; and a pull down voltage compensation circuit including a plurality of pull down transistors selectively actuated in response to bits of the digital pull down voltage compensation code.

14. The integrated circuit of claim 8, wherein the frequency comparison circuit comprises:

a first counter operating to count in response to the first clock signal; and a second counter operating to count in response to the second clock signal and generate a reset signal when a second count of the second counter reaches a threshold count;

wherein counting by the first counter is frozen in response to said reset signal with a first count of the first counter when frozen output as said measured difference in frequency.

15. A method, comprising:

sensing a process and temperature variation operating condition in an integrated circuit;

generating a process and temperature compensation signal in response to the sensed process and temperature variation operating condition;

sensing a voltage variation operating condition that affects the operation of an input/output circuit of said integrated circuit by measuring a difference in frequency between a first clock signal generated in response to a supply voltage subject to voltage variation and a second clock signal generated in response to a fixed bandgap reference voltage;

generating a voltage compensation signal in response to the measured difference in frequency; and altering operation of said input/output circuit in response to the process and temperature compensation signal and the voltage compensation signal;

wherein measuring the difference in frequency comprises:

counting cycles of the first clock signal to generate a first count value;

counting cycles of the second clock signal to generate a second count value;

generating a reset signal in response to the second count value reaching a threshold count;

stopping further counting of cycles of the first clock signal in response to said reset signal; and outputting the first count value after stopping as said measured difference in frequency.

16. The method of claim 15, wherein the process and temperature variation operating condition is sensed in a core circuit region of an integrated circuit die and wherein said voltage variation operating condition is sensed in a peripheral circuit region of the integrated circuit die where the input/output circuit is located.

17. The method of claim 16, wherein the second clock signal is generated by an oscillator located in the core circuit region and wherein the first clock signal is generated by a further oscillator located in the peripheral circuit region.

18. A method, comprising:
sensing a process and temperature variation operating condition that is globally applicable to an integrated circuit die and generating a global process and temperature compensation signal;
sensing a voltage variation operating condition that is locally applicable to an input/output circuit within the integrated circuit die and generating a local voltage compensation signal, wherein the localized voltage operating condition is generated as a function of a measured difference in frequency between a first clock signal generated in response to a supply voltage subject to voltage variation and a second clock signal generated in response to a fixed bandgap reference voltage, by:
comparing a frequency of the first clock signal to a frequency of the second clock signal to generate said measured difference in frequency; and
converting the measured difference in frequency to a digital voltage compensation code for the local voltage compensation signal; and
altering operation of said input/output circuit in response to the global process and temperature compensation signal and in response to the local voltage compensation signal.

19. The method of claim 18, wherein sensing the voltage variation operating condition is performed by circuitry is located within a peripheral circuit region of an integrated circuit die and wherein sensing the process and temperature variation operating condition is performed by circuitry located within a core circuit region of the integrated circuit die.

20. The method of claim 19, wherein the second clock signal is generated by a clock generator circuit located within the core circuit region of the integrated circuit die.

21. The method of claim 20, wherein the first clock signal is generated by an additional clock generator circuit located within the peripheral circuit region of the integrated circuit die.

22. A method, comprising:
sensing a process and temperature variation operating condition that is globally applicable to an integrated circuit die and generating a global process and temperature compensation signal;
sensing a voltage variation operating condition that is locally applicable to an input/output circuit within the integrated circuit die and generating a local voltage compensation signal, wherein the localized voltage operating condition is generated as a function of a measured difference in frequency between a first clock signal generated in response to a supply voltage subject to voltage variation and a second clock signal generated in response to a fixed bandgap reference voltage; and
altering operation of said input/output circuit in response to the global process and temperature compensation signal and in response to the local voltage compensation signal;
wherein measuring the difference in frequency comprises:
counting cycles of the first clock signal to generate a first count value;
counting cycles of the second clock signal to generate a second count value;
generating a reset signal in response to the second count value reaching a threshold count;
stopping further counting of cycles of the first clock signal in response to said reset signal; and
outputting the first count value after stopping as said measured difference in frequency.

23. A method, comprising:
sensing a process and temperature variation operating condition in an integrated circuit;
generating a process and temperature compensation signal in response to the sensed process and temperature variation operating condition;
sensing a voltage variation operating condition that affects the operation of an input/output circuit of said integrated circuit by measuring a difference in frequency between a first clock signal generated in response to a supply voltage subject to voltage variation and a second clock signal generated in response to a fixed bandgap reference voltage;
generating a voltage compensation signal in response to the measured difference in frequency by:
comparing a frequency of the first clock signal to a frequency of the second clock signal to generate said measured difference in frequency; and
converting the measured difference in frequency to a digital voltage compensation code for the voltage compensation signal; and
altering operation of said input/output circuit in response to the process and temperature compensation signal and the voltage compensation signal.

24. The method of claim 23, wherein the process and temperature variation operating condition is sensed in a core circuit region of an integrated circuit die and wherein said voltage variation operating condition is sensed in a peripheral circuit region of the integrated circuit die where the input/output circuit is located.

25. The method of claim 24, wherein the second clock signal is generated by an oscillator located in the core circuit region and wherein the first clock signal is generated by a further oscillator located in the peripheral circuit region.

* * * * *